US008217567B2

(12) United States Patent
van de Ven et al.

(10) Patent No.: US 8,217,567 B2
(45) Date of Patent: Jul. 10, 2012

(54) HOT LIGHT EMITTING DIODE (LED) LIGHTING SYSTEMS

(75) Inventors: Antony P. van de Ven, Sai Kung (HK); Gerald H. Negley, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 245 days.

(21) Appl. No.: 12/483,020

(22) Filed: Jun. 11, 2009

(65) Prior Publication Data

US 2010/0314996 A1     Dec. 16, 2010

(51) Int. Cl.
*H01J 1/62* (2006.01)
*H01J 63/04* (2006.01)

(52) U.S. Cl. ........ 313/501; 313/485; 313/498; 313/499; 313/512; 257/79; 257/80; 257/98; 257/99; 257/100; 362/227; 362/231; 362/249.01; 362/249.02

(58) Field of Classification Search .......... 313/484–487, 313/489, 498, 512, 467, 468, 499, 501–503; 257/98, 99, 100, 80, 79; 362/235, 227, 231, 362/293, 545, 555, 800
See application file for complete search history.

(56) References Cited

U.S. PATENT DOCUMENTS

| | | | |
|---|---|---|---|
| 6,350,041 B1 | 2/2002 | Tarsa et al. | |
| 6,660,175 B2 | 12/2003 | Baretz et al. | |
| 7,213,940 B1 | 5/2007 | van de Ven et al. | |
| 7,878,697 B2* | 2/2011 | Chiang | 362/555 |
| 7,922,359 B2* | 4/2011 | Chiang | 362/294 |
| 2006/0006405 A1* | 1/2006 | Mazzochette | 257/99 |
| 2007/0097692 A1* | 5/2007 | Suehiro et al. | 362/294 |
| 2008/0013316 A1* | 1/2008 | Chiang | 362/264 |
| 2008/0029720 A1* | 2/2008 | Li | 250/581 |
| 2008/0030993 A1 | 2/2008 | Narendran et al. | |
| 2008/0054281 A1 | 3/2008 | Narendran et al. | |
| 2008/0094829 A1 | 4/2008 | Narendran et al. | |

(Continued)

FOREIGN PATENT DOCUMENTS

EP     1 881 259 A1     1/2008
(Continued)

OTHER PUBLICATIONS

Kim et al. "Strongly Enhanced Phosphor Efficiency in GaInN White Light-Emitting Diodes Using Remote Phosphor Configuration and Diffuse Reflector Cup" *Japanese Journal of Applied Physics* 44(21):L649-L651 (2005).

(Continued)

*Primary Examiner* — Peter Macchiarolo
*Assistant Examiner* — Thomas A Hollweg
(74) *Attorney, Agent, or Firm* — Myers Bigel Sibley & Sajovec, P.A.

(57) ABSTRACT

LED lighting systems operate their LED above a junction temperature of 85° C. and space apart from the LED, components of the LED lighting system that reduce an expected lifetime of the LED lighting system to less than 25,000 hours as a result of operating the LED above the junction temperature of 85° C. Accordingly, the LED itself may be driven hotter than is conventionally the case, without impacting its lifetime. By allowing the LED to operate hotter, reduced heat sinking may be needed for the LED itself, which can decrease the cost, size and/or complexity of the thermal management system for the LED lighting system and/or can allow a thermal budget for the LED lighting system to be used elsewhere. Related structures are also described.

15 Claims, 4 Drawing Sheets

U.S. PATENT DOCUMENTS

| | | | |
|---|---|---|---|
| 2008/0105887 A1 | 5/2008 | Narendran et al. | |
| 2008/0117500 A1 | 5/2008 | Narendran et al. | |
| 2008/0128718 A1 | 6/2008 | Sumitani | |
| 2008/0218992 A1* | 9/2008 | Li | 362/84 |
| 2009/0001399 A1* | 1/2009 | Diana et al. | 257/98 |
| 2009/0059582 A1 | 3/2009 | Kulkarni | |
| 2009/0101930 A1 | 4/2009 | Li | |
| 2009/0251882 A1* | 10/2009 | Ratcliffe | 362/84 |
| 2009/0273921 A1* | 11/2009 | Chiang | 362/101 |
| 2009/0273924 A1* | 11/2009 | Chiang | 362/241 |
| 2010/0124243 A1* | 5/2010 | Hussell et al. | 372/45.01 |
| 2010/0277077 A1* | 11/2010 | Pong et al. | 315/152 |
| 2010/0301360 A1* | 12/2010 | van de Ven et al. | 257/98 |
| 2011/0188228 A1* | 8/2011 | Li | 362/84 |
| 2012/0007492 A1* | 1/2012 | Hussell et al. | 313/488 |

FOREIGN PATENT DOCUMENTS

WO     WO 2006/007388 A1     1/2006

OTHER PUBLICATIONS

"*ASSIST Recommends . . . LED Life for General Lighting: Definition of Life*", vol. 1, Issue 1, Feb. 2005.

"*Bright Tomorrow Lighting Competition (L Prize™)*", May 28, 2008, Document No. 08NT006643.

"*Energy Star® Program Requirements for Solid State Lighting Luminaires, Eligibility Criteria—Version 1.1*", Final: Dec. 19, 2008.

Application Note: CLD-APO6.006, entitled *Cree® XLamp® XR Family & 4550 LED Reliability*, published at cree.com/xlamp, Sep. 2008.

Illuminating Engineering Society Standard LM-80-08, entitled "*IES Approved Method for Measuring Lumen Maintenance of LED Light Sources*", Sep. 22, 2008, ISBN No. 978-0-87995-227-3.

Philips Lumileds, Technology White Paper: "Understanding power LED lifetime analysis", downloaded from http://www.philipslumileds.com/pdfs/WP12.pdf, Document No. WP12, Last Modified May 22, 2007.

Notification of Transmittal of the International Search Report and the Written Opinion of the International Searching Authority, or the Declaration; International Search Report; and Written Opinion of the International Searching Authority, PCT Application No. PCT/US2010/037608, Jul. 30, 2010.

International Preliminary Report on Patentability, PCT Application No. PCT/US2010/037608, Sep. 9, 2011.

\* cited by examiner

HOT LIGHT EMITTING DIODE (LED) LIGHTING SYSTEMS

BACKGROUND OF THE INVENTION

This invention relates to lighting systems and methods and, more particularly, to lighting systems and methods that use Light Emitting Diodes (LEDs).

LEDs are increasingly being used in lighting/illumination applications, such as traffic signals, color wall wash lighting, backlights, displays and general illumination, with one ultimate goal being a replacement for the ubiquitous incandescent light bulb. In order to provide a broad spectrum light source, such as a white light source, from a relatively narrow spectrum light source, such as an LED, the relatively narrow spectrum of the LED may be shifted and/or spread in wavelength.

For example, a white LED may be formed by coating a blue emitting LED with an encapsulant material, such as a resin or silicon, that includes therein a wavelength conversion material, such as a YAG:Ce phosphor, that emits yellow light in response to stimulation with blue light. Some, but not all, of the blue light that is emitted by the LED is absorbed by the phosphor, causing the phosphor to emit yellow light. The blue light emitted by the LED that is not absorbed by the phosphor combines with the yellow light emitted by the phosphor, to produce light that is perceived as white by an observer. Other combinations also may be used. For example, a red emitting phosphor can be mixed with the yellow phosphor to produce light having better color temperature and/or better color rendering properties. Alternatively, one or more red LEDs may be used to supplement the light emitted by the yellow phosphor-coated blue LED. In other alternatives, separate red, green and blue LEDs may be used. Moreover, infrared (IR) or ultraviolet (UV) LEDs may be used. Finally, any or all of these combinations may be used to produce colors other than white.

LED lighting systems can offer a long operational lifetime relative to conventional incandescent and fluorescent bulbs. LED lighting system lifetime is typically measured by an "L70 lifetime", i.e., a number of operational hours in which the light output of the LED lighting system does not degrade by more than 30%. Typically, an L70 lifetime of at least 25,000 hours is desirable, and has become a standard design goal. As used herein, L70 lifetime is defined by Illuminating Engineering Society Standard LM-80-08, entitled "*IES Approved Method for Measuring Lumen Maintenance of LED Light Sources*", Sep. 22, 2008, ISBN No. 978-0-87995-227-3, also referred to herein as "LM-80", the disclosure of which is hereby incorporated herein by reference in its entirety as if set forth fully herein.

LEDs also may be energy efficient, so as to satisfy ENERGY STAR® program requirements. ENERGY STAR program requirements for LEDs are defined in "*ENERGY STAR® Program Requirements for Solid State Lighting Luminaires, Eligibility Criteria—Version 1.1*", Final: Dec. 19, 2008, the disclosure of which is hereby incorporated herein by reference in its entirety as if set forth fully herein.

Heat is a major concern in obtaining a desirable operational lifetime. As is well known, an LED also generates considerable heat during the generation of light. The heat is generally measured by a "junction temperature", i.e., the temperature of the semiconductor junction of the LED. In order to provide an acceptable lifetime, for example, an L70 of at least 25,000 hours, it is desirable to ensure that the junction temperature should not be above 85° C. In order to ensure a junction temperature that is not above 85° C., various heat sinking schemes have been developed to dissipate at least some of the heat that is generated by the LED. See, for example, Application Note: CLD-APO6.006, entitled *Cree® XLamp® XR Family & 4550 LED Reliability*, published at cree.com/xlamp, September 2008.

In order to encourage development and deployment of highly energy efficient solid state lighting (SSL) products to replace several of the most common lighting products currently used in the United States, including 60-watt A19 incandescent and PAR 38 halogen incandescent lamps, the Bright Tomorrow Lighting Competition (L Prize™) has been authorized in the Energy Independence and Security Act of 2007 (EISA). The L Prize is described in "*Bright Tomorrow Lighting Competition (L Prize™)*", May 28, 2008, Document No. 08NT006643, the disclosure of which is hereby incorporated herein by reference in its entirety as if set forth fully herein. The L Prize winner must conform to many product requirements including light output, wattage, color rendering index, correlated color temperature, expected lifetime, dimensions and base type.

SUMMARY OF THE INVENTION

LED lighting systems according to various embodiments described herein, can operate an LED above a junction temperature of 85° C. and can space apart from the LED, components of the LED lighting system that reduce an expected L70 lifetime of the LED lighting system to less than 25,000 hours as a result of operating the LED above the junction temperature of 85° C. Accordingly, the LED itself may be driven hotter than is conventionally the case, without impacting the expected L70 performance. By allowing the LED to operate hotter, reduced heat sinking may be needed for the LED itself, which can decrease the cost, size and/or complexity of the thermal management system for the LED lighting system and/or can allow a thermal budget for the LED lighting system to be used elsewhere.

In some embodiments, the junction temperature is above 125° C. and, in other embodiments, the junction temperature is between 160° C. and 200° C. Moreover, in other embodiments, the expected L70 lifetime of the LED lighting system is at least 50,000 hours. In still other embodiments, the LED lighting system further conforms to the ENERGY STAR Program Requirements for Solid State Lighting Luminaires. In yet other embodiments, the LED lighting system further conforms to the product requirements for light output, wattage, color rendering index, correlated color temperature, expected lifetime, dimensions and base type for a 60-watt A19 Incandescent Replacement for the L Prize. In still other embodiments, the LED light system further conforms to the product requirements for light output, wattage, color rendering index, correlated color temperature, expected lifetime, dimensions and base type for a PAR 38 halogen replacement for the L Prize.

LED lighting systems according to various embodiments described herein include a bare LED die and a power supply that is electrically connected to the bare LED die, and is configured to bias the bare LED die so as to allow a junction temperature of the bare LED die above 85° C. A wavelength conversion material is spaced apart from the bare LED die, and is configured to downconvert at least some of the light that is emitted by the bare LED die, so as to provide an expected L70 lifetime of the LED lighting system of at least 25,000 hours. In other embodiments, an expected L70 lifetime of at least 50,000 hours is provided. Moreover, in other embodiments, the power supply is spaced apart from the bare LED die.

In some embodiments, the LED lighting system includes a transparent bulb and a screw-type base at the base of the bulb. The bare LED die is located within the bulb. The power supply is located within the base and the wavelength conversion material is on the transparent bulb.

In some embodiments, the bare LED die is devoid of an encapsulant thereon. In other embodiments, the bare LED die is devoid of silicone-based and epoxy-based encapsulant thereon. In still other embodiments, the bare LED die includes an outer layer comprising silicon nitride and/or aluminum oxide, such as sapphire.

Moreover, in some embodiments, the power supply is configured to bias the bare LED die so as to maintain a junction temperature that is above 125° C. In other embodiments, a junction temperature between 160° C. and 200° C. is maintained.

Moreover, in yet other embodiments, the LED lighting system further conforms to the ENERGY STAR Program Requirements for Solid State Lighting Luminaires. In still other embodiments, the LED lighting system further conforms to the product requirements for light output, wattage, color rendering index, correlated color temperature, expected lifetime, dimensions and base type for a 60-watt A19 Incandescent Replacement for the L Prize. In yet other embodiments, the LED light system further conforms to the product requirements for light output, wattage, color rendering index, correlated color temperature, expected lifetime, dimensions and base type for a PAR 38 halogen replacement for the L Prize.

LED lighting systems according to still other embodiments comprise an LED that is devoid of a material thereon that degrades an exposed light output of the LED lighting system beyond a specified amount over a specified lifetime at an LED junction temperature above 85° C. A power supply is electrically connected to the LED and is configured to bias the LED so as to allow the junction temperature above 85° C. A wavelength conversion material is spaced apart from the LED and is configured to downconvert at least some of the light that is emitted by the LED. The wavelength conversion material is also spaced apart from the LED sufficiently so as not to degrade the expected light output of the LED lighting system beyond the specified amount over the specified expected lifetime.

In some embodiments, the LED is devoid of material that degrades at an LED junction temperature of over 160° C., and the power supply is configured to bias the LED so as to maintain the junction temperature of over 160° C.

In some embodiments, the LED is devoid of an encapsulant thereon. In other embodiments, the LED is devoid of an encapsulant thereon having carbon-carbon double bonds. In still other embodiments, the LED includes an outer layer comprising silicon nitride and/or aluminum oxide, such as sapphire. In yet other embodiments, the LED is devoid of silicone-based and epoxy-based encapsulant thereon.

In some embodiments, the LED is devoid of a heat sink thereon, but the power supply includes a heat sink coupled thereto. The heat sink may include fins.

In still other embodiments, the LED comprises a blue LED and the LED lighting system further includes a red LED. In some of these embodiments, the LED lighting system may also include a thermal management structure that provides greater thermal dissipation for the red LED than for the blue LED. For example, a heat sink may be thermally coupled to the red LED, whereas the blue LED may be devoid of a heat sink thereon. In other embodiments, a heat sink is thermally coupled to the power supply. In still other embodiments, the LED lighting system includes a transparent bulb and a screw-type base at the base of the bulb. The LED is located within the bulb. The power supply is located within the base and the wavelength conversion material is on the bulb.

In some embodiments, the junction temperature is above 125° C. and, in other embodiments, the junction temperature is between 160° C. and 200° C. Moreover, in other embodiments, the expected L70 lifetime of the LED lighting system is at least 50,000 hours. In still other embodiments, the LED lighting system further conforms to the ENERGY STAR Program Requirements for Solid State Lighting Luminaires. In yet other embodiments, the LED lighting system further conforms to the product requirements for light output, wattage, color rendering index, correlated color temperature, expected lifetime, dimensions and base type for a 60-watt A19 Incandescent Replacement for the L Prize. In still other embodiments, the LED light system further conforms to the product requirements for light output, wattage, color rendering index, correlated color temperature, expected lifetime, dimensions and base type for a PAR 38 halogen replacement for the L Prize.

DETAILED DESCRIPTION

Figure 1:
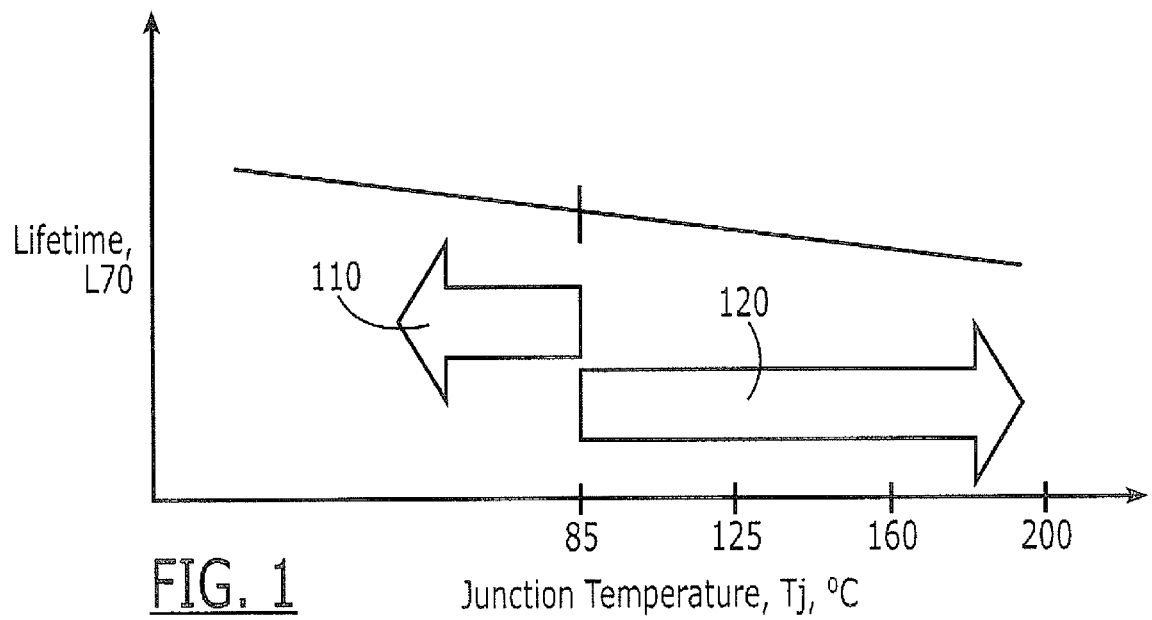
FIG. 1 graphically illustrates lifetime vs. junction temperature according to various embodiments.

The present invention now will be described more fully with reference to the accompanying drawings, in which various embodiments are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. Furthermore, relative terms such as "beneath" or "overlies" may be used herein to describe a relationship of one layer or region to another layer or region relative to a substrate or base as illustrated in the figures. It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items and may be abbreviated as "/".

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional and/or other illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as a rectangle will, typically, have rounded or curved features due to normal manufacturing tolerances. Thus, the regions illustrated in the figures are schematic in nature and their shapes are not intended to illustrate the precise shape of a region of a device and are not intended to limit the scope of the invention, unless otherwise defined herein. Moreover, all numerical quantities described herein are approximate and should not be deemed to be exact unless so stated.

Unless otherwise defined herein, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

As used herein, a layer or region is considered to be "transparent" when at least some of the radiation that impinges on the transparent layer or region emerges through the transparent layer or region. Moreover, the term "phosphor" is used synonymously for any wavelength conversion material(s). The term "L70 lifetime" is defined as measured by LM-80, cited above. The term "ENERGY STAR" is defined by "*ENERGY STAR Program Requirements for Solid State Lighting Luminaires, Version 1.0*", cited above. The term "L Prize" is defined by the "*Bright Tomorrow Lighting Competition (L Prize™)*" Publication No. 08NT006643, cited above.

Various embodiments are described herein with reference to "expected L70 lifetime." Because the lifetimes of solid state lighting products are measured in the tens of thousands of hours, it is generally impractical to perform full term testing to measure the lifetime of the product. Therefore, projections of lifetime from test data on the system and/or light source are used to project the lifetime of the system. Such testing methods include, but are not limited to, the lifetime projections found in the ENERGY STAR Program Requirements cited above or described by the ASSIST method of lifetime prediction, as described in "*ASSIST Recommends . . . LED Life For General Lighting: Definition of Life*", Volume 1, Issue 1, February 2005, the disclosure of which is hereby incorporated herein by reference as if set forth fully herein. Accordingly, the term "expected L70 lifetime" refers to the predicted L70 lifetime of a product as evidenced, for example, by the L70 lifetime projections of ENERGY STAR, ASSIST and/or a manufacturer's claims of lifetime.

Some embodiments can use gallium nitride (GaN)-based LEDs on silicon carbide (SiC)-based mounting substrates. However, it will be understood by those having skill in the art that other embodiments of the present invention may be based on a variety of different combinations of mounting substrate and epitaxial layers. For example, combinations can include AlGaInP LEDs on GaP mounting substrates; InGaAs LEDs on GaAs mounting substrates; AlGaAs LEDs on GaAs mounting substrates; SiC LEDs on SiC or sapphire ($Al_2O_3$) mounting substrates and/or Group III-nitride-based LEDs on gallium nitride, silicon carbide, aluminum nitride, sapphire, zinc oxide and/or other mounting substrates. Moreover, in other embodiments, a mounting substrate may not be present in the finished product. In some embodiments, the LEDs may be gallium nitride-based LED devices manufactured and sold by Cree, Inc. of Durham, N.C., and described generally at cree.com.

Some embodiments described herein may arise from recognition that an LED can be operated at a higher junction temperature ("hotter") than is conventionally used, while still maintaining an acceptable expected L70 lifetime, if the components of the LED lighting system that degrade under the hotter temperature over the desired expected L70 lifetime are spaced apart from the LED. Typically, these components include encapsulant that is used to encapsulate and index match the LED, and wavelength conversion material such as phosphor, which is used to provide downconversion. By spacing these components away from the LED, the LED can be operated at a higher junction temperature than is conventional, while still preserving the expected L70 lifetime. Since the LED can operate at a higher junction temperature, less thermal management, in the form of heat sinks or other conventional thermal management systems, may be needed. By allowing lower thermal management, the size, cost and/or complexity of the LED lighting system can be reduced and/or the limited thermal budget may be applied to other components of the LED lighting system, such as the power supply, which may benefit more from increased heat sinking.

FIG. 1 graphically illustrates LED lighting system lifetime, such as L70 lifetime, as a function of LED junction temperature. It will be understood that FIG. 1 is merely representative of the decrease in lifetime as a function of junction temperature. For a given LED lighting system, this decrease need not be linear or monotonic.

Referring now to FIG. 1, as shown by arrow 110, it is conventionally desirable to decrease the junction temperature of the LED, to thereby allow improved lifetime. Typically, junction temperatures are not allowed to exceed 85° C., and it is generally desirable to decrease the junction temperature as much as possible.

In sharp contrast, arrow 120 indicates that an allowed junction temperature of an LED may be increased above 85° C. according to various embodiments described herein. In fact, in some embodiments, a junction temperature above 125° C. may be allowed, and in other embodiments, a junction temperature of between 160° C. and 200° C. may be allowed. By allowing hot LED operation according to various embodiments described herein, a desired expected operational lifetime, such as L70, may be maintained while allowing greater flexibility in the thermal management of the LED lighting system.

Figure 2:
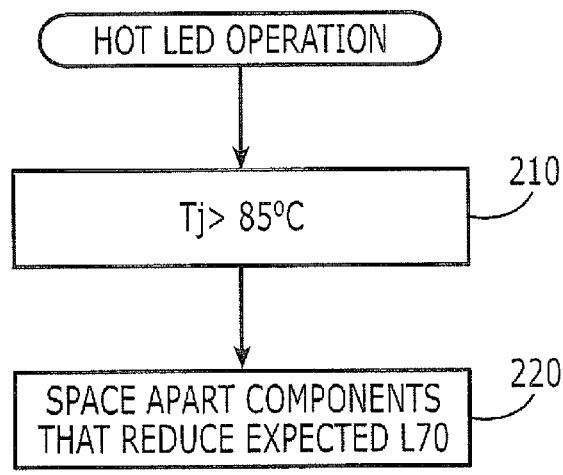
FIG. 2 is a flowchart of hot LED operation according to various embodiments.

FIG. 2 is a flowchart of hot LED operations according to various embodiments. Referring to FIG. 2, at Block 210, an LED is operated above a junction temperature (Tj) of 85° C. At Block 220, components of the LED lighting system that reduce expected L70 less than 25,000 hours, are spaced apart from the LED that is operating above a junction temperature of about 85° C. Thus, in some embodiments, these components of the LED lighting system that reduce expected L70 below 25,000 hours operate at a temperature that is below 85° C. in a room temperature ambient. It will also be understood that in some embodiments, the junction temperature may be above 125° C., and in other embodiments the junction temperature may be between 160° C. and 200° C. Moreover, the expected L70 lifetime may be 50,000 hours in other embodiments. Also, the LED lighting system may further conform to the ENERGY STAR Program Requirements for Solid State Lighting Luminaires, in some embodiments. Finally, in other embodiments, the LED lighting system may further conform to the product requirements for light output, wattage, color rendering index, correlated color temperature, expected lifetime, dimensions and base type for a 60-watt A19 Incandescent Replacement or a PAR 38 halogen replacement for the L Prize.

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated.

As will be described in more detail below, some embodiments can operate the LED above a junction temperature of 85° C. by providing an unencapsulated LED and an LED lighting system that uses remote phosphor. Remote phosphor is described, for example, in U.S. Pat. No. 6,350,041 to Tarsa et al. Since the LED may be driven above 85° C. without undue concern about lifetime effects due to degradation of the encapsulant or phosphor, the expected L70 figure of merit may be maintained. There may be a penalty on initial light output due to the LED not being encased by encapsulant that can provide index matching (for example index of refraction of 1.5). For example, there may be a 12% penalty on light output for not encasing the LED in encapsulation. However, the expected L70 lifetime may be maintained. Moreover, in attempting to provide an LED lighting system in a form factor of a standard "A-type" light bulb or a PAR halogen bulb, the amount of area for heat sinking may be severely restricted. Accordingly, being allowed to trade off between the light output and junction temperature may be highly desirable, as long the lifetime constraint can be maintained.

Figure 3:
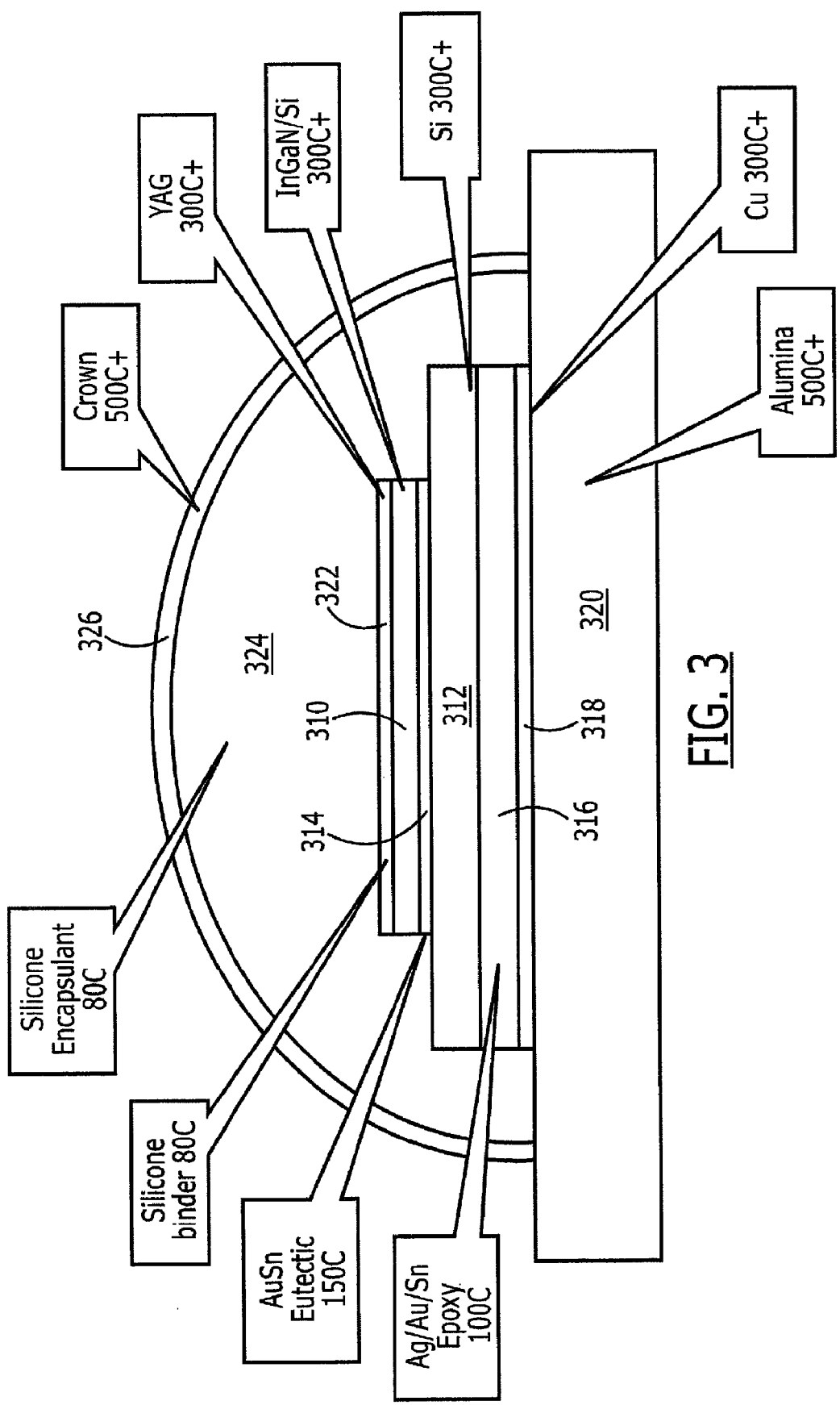
FIG. 3 is a cross-sectional view of an encapsulated LED illustrating melting points of various components thereof.

FIG. 3 is a cross-sectional view of a conventional encapsulated LED including a thermal analysis. The encapsulated LED includes an indium gallium nitride/silicon (InGaN/Si) die 310 that is bonded to a silicon substrate 312, using gold/tin (AuSn) eutectic die attach material 314. An epoxy 316 is used to mount the substrate 312 on a copper trace 318, which itself is on an alumina substrate 320. A silicon binder 322 that contains therein YAG phosphor is provided on the die 310. Moreover, an encapsulant 324, such as a silicone encapsulant, surrounds the die 310 and phosphor 322. A dome or crown 326 is also provided.

FIG. 3 also provides an indication of a temperature at which the various materials melt or degrade. The temperatures that may not be impacted by an LED junction operation above 85° C. are shown at the right of FIG. 3. In particular, the alumina substrate 320, the copper trace 318, the silicon substrate 312, the InGaN/Si LED die 310, the YAG phosphor in the binder 322 and the crown 326 may not be impacted, as these components are stable at relatively high temperatures. The melting/degradation temperatures of those components that can be adversely affected are shown at the left of FIG. 3. In particular, the epoxy 316 may degrade at 100° C., the AuSn solder 314 may have a melting temperature of 150° C., the silicone binder 322 for the phosphor coating may degrade at 80° C., and the silicone encapsulant 324 may also degrade at 80° C.

Accordingly, the epoxy 316, die attach material 314, silicone binder 322 and silicone encapsulant 324 may have a severe impact on LED lifetime if a junction temperature over 85° C. is allowed. The silicone encapsulant 324 and silicone binder 322 may be especially problematic.

Figure 4:
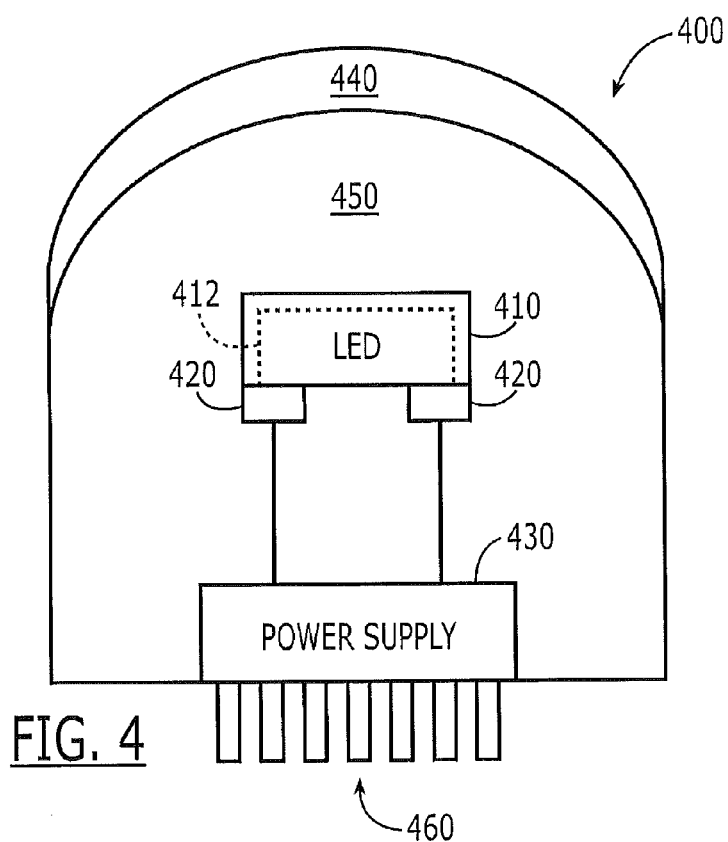
FIGS. 4-6 are cross-sectional views of LED lighting systems according to various embodiments.

FIG. 4 is a schematic cross-sectional diagram of an LED lighting system according to various embodiments. Referring to FIG. 4, the LED lighting system 400 includes a bare LED die 410. A power supply 430 is electrically connected to, and in some embodiments spaced apart from, the bare LED die 410, and is configured to bias the bare LED die 410 so as to allow a junction temperature of the bare LED die 410 above 85° C. The power supply 430 may provide a ballast for the LED lighting system by converting an input alternating current (AC) to a direct current (DC). However, in other embodiments, the power supply may only include a resistor or any other device that sets a bias current for the bare LED die 410. A wavelength conversion material 440, for example phosphor, is spaced apart from the bare LED die 410, and is configured to downconvert at least some of the light that is emitted by the bare LED die 410, so as to provide an expected L70 lifetime of the LED lighting system of at least 25,000 hours. In some embodiments, the junction temperature of the bare LED die 410 is above 125° C. and in other embodiments the junction temperature is between 160° C. and 200° C. Moreover, in some embodiments, the expected L70 lifetime is 50,000 hours.

As shown in FIG. 4, in some embodiments the bare LED die is devoid of an encapsulant thereon. In some embodiments, the space 450 between the phosphor 440 and the bare LED die 410 is also devoid of encapsulant. In some embodiments, an encapsulant may be provided that is not silicone-based or epoxy-based, so as to withstand the hot LED temperature while maintaining a desired expected L70=25,000 hours. In still other embodiments, the LED may be devoid of an encapsulant thereon that has carbon-carbon double bonds. For example, conventional silicone encapsulants may not be used.

As also shown, the bare LED die 410 may be attached to the power supply 430 using an attachment structure 420 that also does not degrade as a result of the higher junction temperature during the expected lifetime. For example, conventional wire bonds or other high temperature attachment techniques, such as soldering, brazing, welding, crimping, etc., may be used.

It will also be understood that, although the bare LED die 410 may not include a silicone-based encapsulant thereon, it may be desirable to protect the semiconductor materials of the bare LED die from the external environment. Accordingly, the bare LED die 410 may include an outer layer 412 of silicon nitride and/or aluminum oxide ($Al_2O_3$), such as sapphire, to protect the bare LED die 410. Silicon dioxide may be employed on the outer layer 412, but may be less desirable because it may not provide an adequate moisture barrier. Silicon nitride and/or sapphire (index of refraction of about 1) may not provide as good index matching of conventional encapsulants (index of refraction of about 1.5), but may protect the bare LED die 410 from the environment.

FIG. 4 also illustrates other embodiments wherein an LED lighting system 400 includes an LED 410 that is devoid of material thereon that degrades an expected light output of the LED lighting system 400 beyond a specified amount (e.g., L70) over a specified lifetime (e.g. 25,000 hours) at an LED junction temperature of over 85° C. A power supply 430 is electrically connected to the LED using an electrical connection structure 420, and is configured to bias the LED 410 so as to allow the junction temperature of over 85° C. A wavelength conversion material 440 is spaced apart from the LED 410 and is configured to downconvert at least some of the light that is emitted by the LED 410. The wavelength conversion material is spaced apart from the LED sufficiently so as not to degrade the expected light output of the LED lighting system beyond the specified amount over the specified lifetime.

In these embodiments, the LED 410 may be devoid of an encapsulant thereon having carbon-carbon double bonds, may be devoid of a silicone-based encapsulant thereon and/or may include an outer layer 412 comprising silicon nitride and/or sapphire. Moreover, in some embodiments, the LED 410 is devoid of a heat sink, and in some embodiments devoid of a finned heat sink thereon, whereas the power supply 430 may include a finned heat sink 460 coupled thereto. Thus, a greater proportion, and in some embodiments all, of the heat sinking that is available may be devoted to the power supply 430 rather than to the LED 410 itself.

Figure 5:
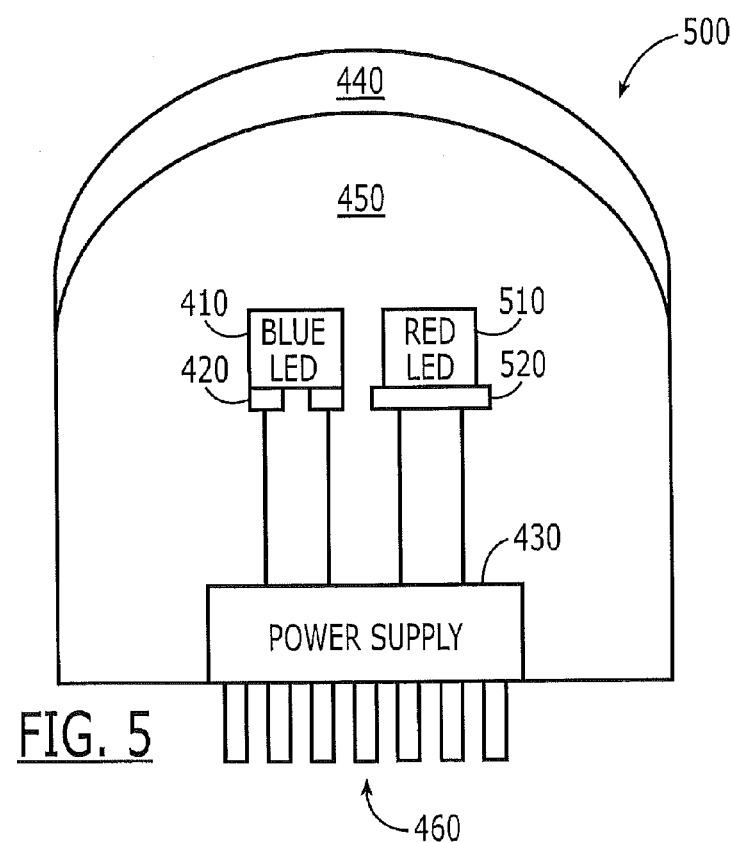

FIG. 5 is a cross-sectional view of LED lighting systems according to other embodiments. In these LED lighting systems 500, a red LED 510 is also provided in addition to a blue LED 410. The use of a red LED to supplement a blue LED is described, for example, in U.S. Pat. No. 7,213,940 to the present inventors, the disclosure of which is hereby incorporated herein by reference in its entirety as if set forth fully herein.

In some embodiments, the red LED 510 may be provided with heat sinking 520, to provide a desired junction temperature, while the blue LED 410 may be devoid of heat sinking. In other embodiments, the attachment structure 420 for the blue LED 410 and the heat sinking 520 for the red LED 510 can provide a thermal management structure that provides greater thermal dissipation for the red LED 520 than for the blue LED 410. Stated differently, because the thermal dissipation requirements on the blue LED 410 may be relaxed according to various embodiments described herein, the thermal budget may be used by the power supply 430 and/or the red LED 510. By decoupling thermal management of the red and blue LEDs, improved color rendering may be provided.

Figure 6:
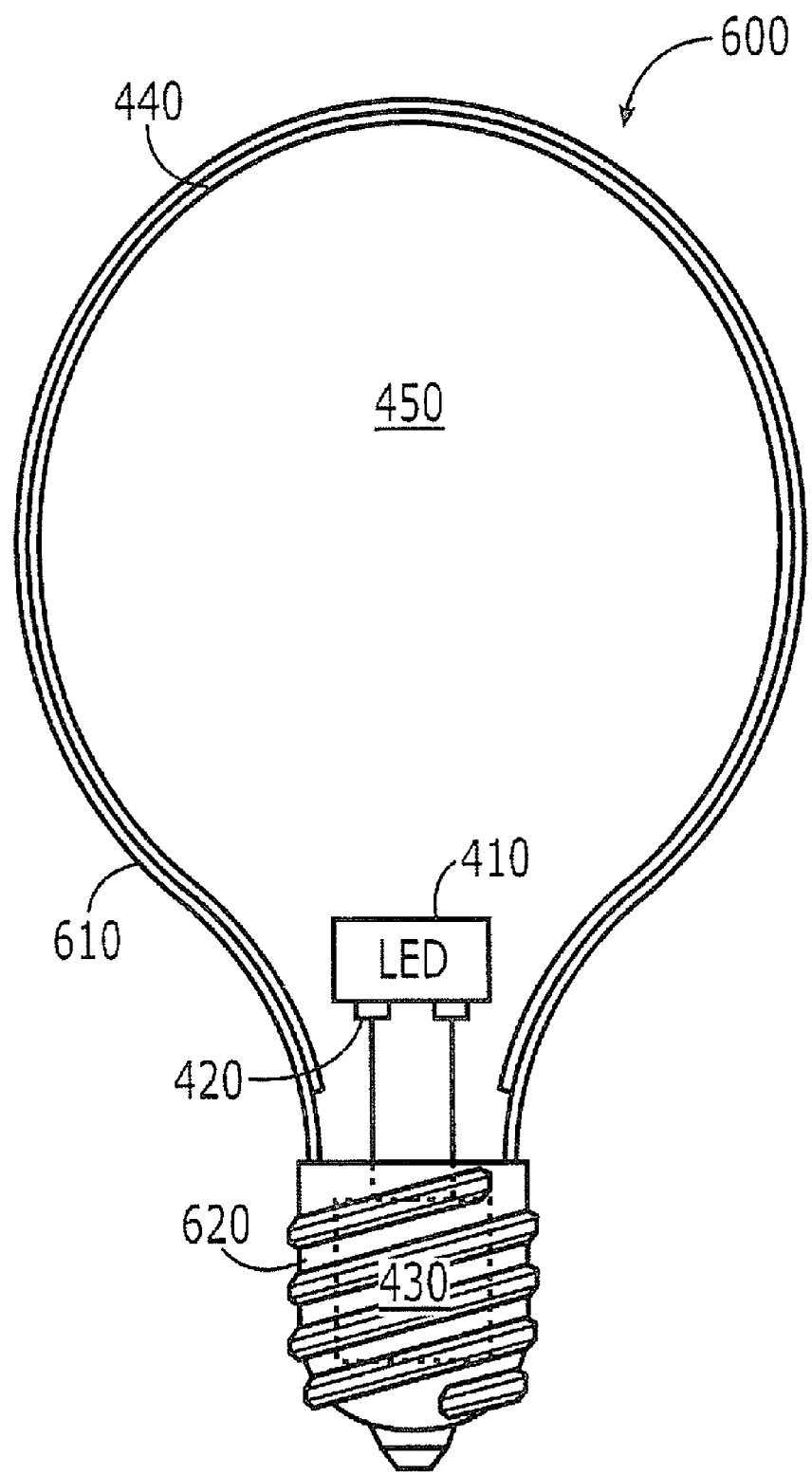

FIG. 6 is a cross-sectional view of other embodiments. In these embodiments, the LED lighting system 600 is designed as a replacement for conventional "A-type" form factor light bulbs. This light bulb replacement includes a transparent bulb 610 and a screw-type base 620 at the base of the bulb 610. The bare LED die 410 is located within the bulb 610, the power supply 430 is located within the base 620, and the wavelength conversion material, such as phosphor 440, is on the transparent bulb 610, for example as a coating on the inside of the bulb 610. Other remote phosphor configurations may be provided. By reducing the size of the heat sink needed for the LED 410, and using a remote phosphor 440 and hot LEDs 410, small footprint lighting systems 600 can be provided.

Accordingly, various embodiments as described herein can conform to the ENERGY STAR Program Requirements for Solid State Lighting Luminaires. Moreover, various embodiments described herein can conform to the product requirements for light output, wattage, color rendering index, correlated color temperature, expected lifetime, dimensions and base type for a 60-watt A19 Incandescent Replacement for the L Prize. Other embodiments can conform to the product requirements for light output, wattage, color rendering index, correlated color temperature, expected lifetime, dimensions and base type for a PAR 38 halogen replacement for the L Prize.

Additional discussion of various embodiments will now be provided. In particular, it is known to use remote phosphor in combination with a blue LED. See, for example, U.S. Pat. No. 6,350,041 to Tarsa et al. Remote phosphors may be desirable because the phosphor/binder can be degraded by heat from the LED, which may result in reduced light output and/or color shift. Thus, conventional phosphor-coated white LEDs generally have lower maximum junction temperature than corresponding LEDs without the phosphor. Heat sinking of phosphor-coated LEDs has, thus, become a major challenge in developing general illumination solid-state lighting fixtures or lamps.

Some embodiments described herein can reduce the need for heat sinking by using a remote phosphor and unencapsulated blue, or blue and red LEDs, and operating the LEDs at higher temperatures. In fact, the junction temperature may be above the temperature at which the LED output decreases. For example, blue LEDs may be operated with a junction temperature of 160° C. or greater. Such operation may decrease the LED output by, for example, about 12% compared to devices operating at 85° C., but the increased heat would not be translated to the phosphor. Thus, the phosphor can be at a lower temperature than the LED die, which can reduce or prevent thermal quenching of the phosphor and/or degradation of the binder of the phosphor.

By reducing the size of the heat sink that is needed, using remote phosphor and hot LEDs, smaller self-ballasted lamps or other small footprint LED lighting systems can be made. For example, given the size restrictions on a conventional A-type form factor lamp, it may be difficult to provide enough heat sink area to dissipate heat from the LEDs to maintain an 85° C. junction temperature under standard operating currents, such as about 350 mA. While decreasing the operating current may increase the efficiency of the LEDs and reduce the needed surface area for heat sinks, it also reduces the output of the LEDs. It may be difficult to obtain sufficient lighting output from a lamp with an A-type lamp form factor if the current is reduced to a level where the heat may be dissipated by the available heat sink area. Moreover, adding more LEDs does not solve the problem, as the added LEDs would still need to have heat dissipated.

In contrast, various embodiments described herein can reduce or overcome this problem by allowing the LED chips to operate at higher temperatures and using a remote phosphor. The reduced light output from thermal roll-off of the LEDs may either be accepted as less than the reduction that would result from the reducing the drive current to achieve a lower junction temperature, or may be overcome, at least in part, by increasing the number of LEDs.

It will also be understood that various embodiments have been described herein using blue and red LEDs and a remote phosphor to produce high efficiency, high color rendering index, as described in U.S. Pat. No. 7,213,940. In other embodiments, high efficiency, lower color rendering index combinations of Portland orange and blue could be used. Moreover, different blue wavelengths could also be used to improve color rendering, as described in the above-cited U.S. Pat. No. 7,213,940.

Accordingly, various embodiments described herein can provide a lighting system such as a self-ballasted lamp that includes its own power supply and that uses remote phosphor, unencapsulated LEDs and a heat sink, where the heat sink is sized such that the LEDs operate at an elevated junction temperature.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A Light Emitting Diode (LED) lighting system comprising:
    an unpackaged LED die that is devoid of encapsulant directly thereon;
    a power supply that is electrically connected to the unpackaged LED die and that is configured to bias the unpackaged LED die so as to allow a junction temperature of the unpackaged LED die above 85° C.; and
    a wavelength conversion material that is spaced apart from the unpackaged LED die and that is configured to down-convert at least some of the light that is emitted by the unpackaged LED die, so as to provide an expected L70 lifetime of the LED lighting system of at least 25,000 hours.

2. An LED lighting system according to claim 1 wherein the power supply is spaced apart from the unpackaged LED die.

3. An LED lighting system according to claim 2 further comprising a transparent bulb and a screw-type base at the base of the bulb, wherein the unpackaged LED die is located within the bulb, the power supply is located within the base and the wavelength conversion material is on the transparent bulb.

4. An LED lighting system according to claim 1 wherein the junction temperature that is above 85° C. is above 125° C.

5. An LED lighting system according to claim 1 wherein the junction temperature that is above 85° C. is between 160° C. and 200° C.

6. An LED lighting system according to claim 1 wherein the unpackaged LED die includes an outer layer comprising silicon nitride and/or aluminum oxide.

7. An LED lighting system according to claim 1 wherein the unpackaged LED die is devoid of silicone-based and epoxy-based encapsulant thereon.

8. An LED lighting system according to claim 1 wherein the expected L70 lifetime of the LED lighting system is at least 50,000 hours.

9. An LED lighting system according to claim 1 wherein the unpackaged LED die is devoid of an encapsulant thereon having carbon-carbon double bonds.

10. An LED lighting system according to claim 1 wherein the unpackaged LED die is devoid of a heat sink thermally coupled thereto.

11. An LED lighting system according to claim 10 wherein the power supply includes a heat sink thermally coupled thereto.

12. An LED lighting system according to claim 11 wherein the heat sink comprises fins.

13. An LED lighting system according to claim 3 wherein the bulb includes a heat sink thermally coupled to the power supply.

14. A Light Emitting Diode (LED) lighting system comprising:
    an unpackaged LED die that is devoid of encapsulant directly thereon;
    a power supply that is electrically connected to the unpackaged LED die and that is configured to bias the unpackaged LED die so as to allow a junction temperature of the unpackaged LED die above 85° C.; and
    a wavelength conversion material that is spaced apart from the unpackaged LED die and that is configured to down-convert at least some of the light that is emitted by the unpackaged LED die, so as to provide an expected L70 lifetime of the LED lighting system of at least 25,000 hours;
    wherein the unpackaged LED die comprises a blue unpackaged LED die and the LED lighting system further comprises a red LED, wherein the LED lighting system comprises a thermal management structure that provides greater thermal dissipation for the red LED than for the blue unpackaged LED die.

15. An LED lighting system according to claim 14 wherein the thermal management structure comprises a heat sink that is thermally coupled to the red LED and wherein the blue unpackaged LED die is devoid of a heat sink directly thereon.

* * * * *

UNITED STATES PATENT AND TRADEMARK OFFICE
CERTIFICATE OF CORRECTION

PATENT NO. : 8,217,567 B2  Page 1 of 1
APPLICATION NO. : 12/483020
DATED : July 10, 2012
INVENTOR(S) : van de Ven et al.

It is certified that error appears in the above-identified patent and that said Letters Patent is hereby corrected as shown below:

On the Title Page:
(Item 56) References Cited, U.S. Patent Documents:
Please correct "6,660,175   B2   12/2003   Baretz et al."
to read -- 6,600,175   B1   7/2003   Baretz et al. --

Signed and Sealed this
Fourteenth Day of May, 2013

Teresa Stanek Rea
*Acting Director of the United States Patent and Trademark Office*